US012575399B2

(12) United States Patent
Penny et al.

(10) Patent No.: US 12,575,399 B2
(45) Date of Patent: Mar. 10, 2026

(54) INTERCONNECT STRUCTURE INCLUDING VERTICALLY STACKED POWER AND GROUND LINES

(71) Applicant: International Business Machines Corporation, Armonk, NY (US)

(72) Inventors: Christopher J. Penny, Saratoga Springs, NY (US); Nicholas Anthony Lanzillo, Wynantskill, NY (US); Albert Chu, Nashua, NH (US); Ruilong Xie, Niskayuna, NY (US); Lawrence A. Clevenger, Saratoga Springs, NY (US); Daniel James Dechene, Albany, NY (US); Eric Miller, Watervliet, NY (US); Prasad Bhosale, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 867 days.

(21) Appl. No.: 17/585,351

(22) Filed: Jan. 26, 2022

(65) Prior Publication Data

US 2023/0238323 A1 Jul. 27, 2023

(51) Int. Cl.
H01L 23/528 (2006.01)
H01L 21/768 (2006.01)

(52) U.S. Cl.
CPC .... H01L 23/5286 (2013.01); H01L 21/76802 (2013.01); H01L 21/76877 (2013.01); H01L 23/5283 (2013.01)

(58) Field of Classification Search
CPC ........... H01L 23/5286; H01L 21/76802; H01L 21/76877; H01L 23/5283; H01L 23/5226
See application file for complete search history.

(56) References Cited

U.S. PATENT DOCUMENTS

| | | | |
|---|---|---|---|
| 7,760,578 B2 | 7/2010 | David | |
| 9,064,079 B2 | 6/2015 | Yang | |
| 9,502,351 B1 | 11/2016 | Sahu | |
| 9,601,545 B1 * | 3/2017 | Tu | H10B 63/80 |
| 9,653,394 B2 | 5/2017 | Lau | |
| 10,510,774 B2 | 12/2019 | Debacker | |

(Continued)

FOREIGN PATENT DOCUMENTS

| | | |
|---|---|---|
| EP | 3229270 A1 | 10/2017 |
| EP | 3475984 A1 | 5/2019 |

OTHER PUBLICATIONS

Sun ik He. Detailed Placement for IR Drop Mitigation by Power Staple Insertion in Sub-10nm VLSI. 2019 EDAA. pp. 6.

(Continued)

*Primary Examiner* — Thanh T Nguyen
(74) *Attorney, Agent, or Firm* — L. Jeffrey Kelly; Otterstedt & Kammer PLLC

(57) ABSTRACT

Interconnect structures including signal lines, power lines and ground lines are configured for improvements in routing and scaling. Vertical stacking of the relatively wide power and ground lines allows for additional signal tracks in the same footprint of a standard cell or other electronic device. Alternatively, vertical stacking of the signal lines allows an increased number of signal tracks. Such interconnect structures are formed during back-end-of-line processing using subtractive or damascene interconnect integration techniques.

18 Claims, 6 Drawing Sheets

(56)  References Cited

U.S. PATENT DOCUMENTS

| 10,886,224 | B2 | 1/2021 | Gerousis | |
| 2022/0122994 | A1* | 4/2022 | Kim | H10D 30/43 |
| 2024/0081035 | A1 | 3/2024 | Hirose | |

OTHER PUBLICATIONS

Peter Mell and Timothy Grance, The NIST Definition of Cloud Computing, NIST Special Publication 800-145, Sep. 2011, cover, pp. i-iii and 1-3.
Hossen et al., "Power Delivery Network (PDN) Modeling for Backside-PDN Configurations With Buried Power Rails and μTSVs", IEEE Transactions on Electron Devices, Dec. 13, 2019, pp. 11-17.

* cited by examiner

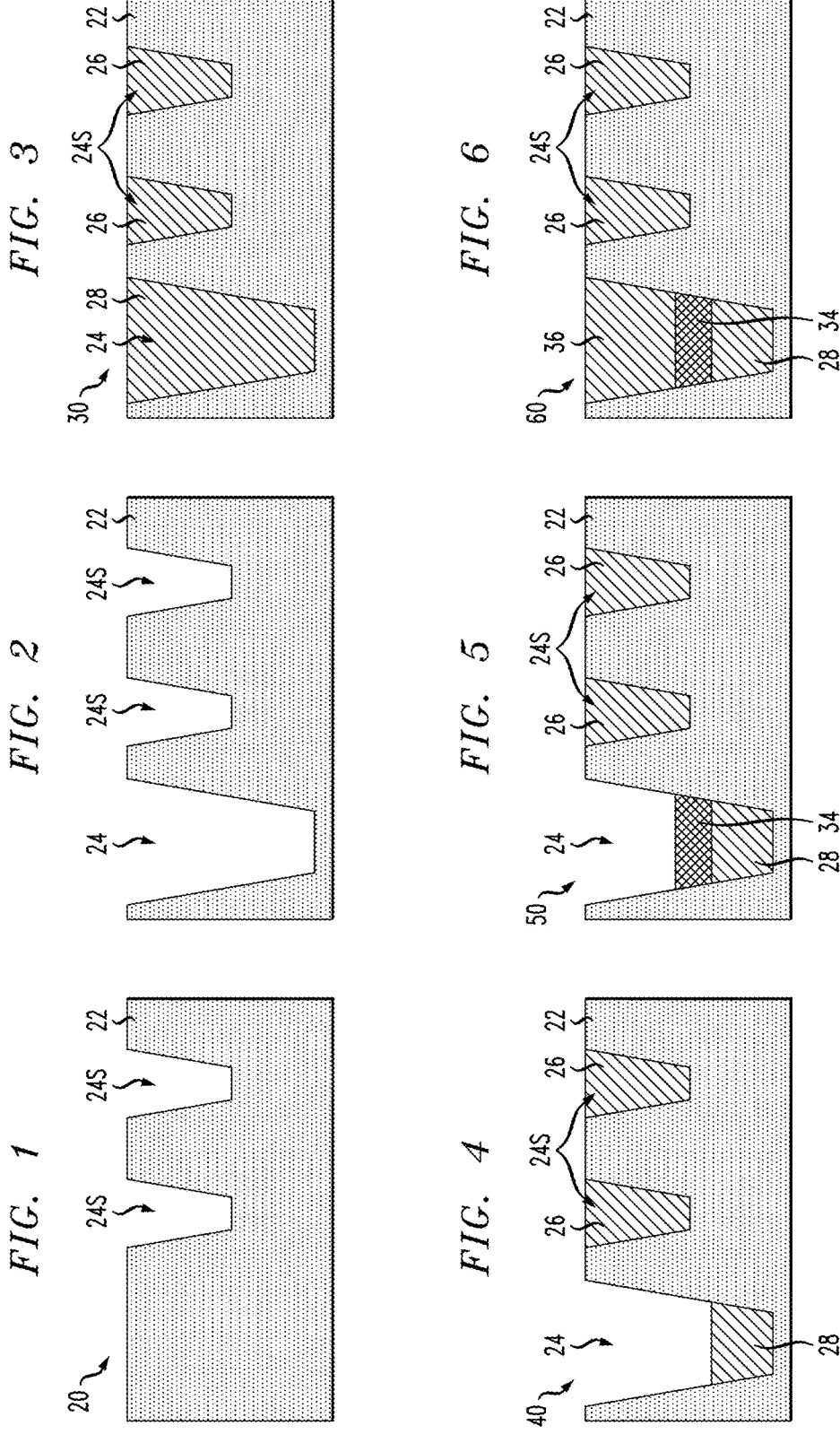

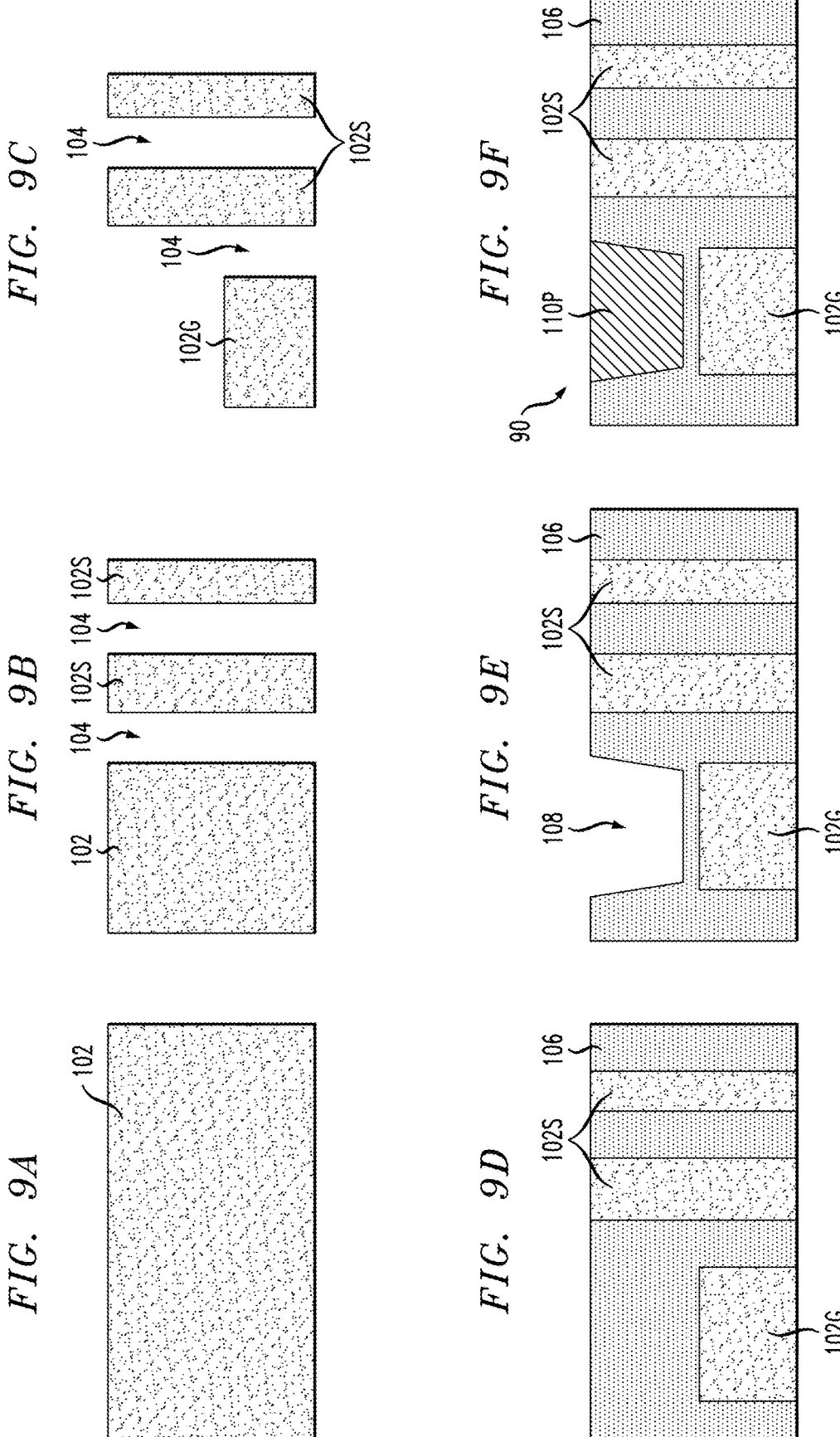

INTERCONNECT STRUCTURE INCLUDING VERTICALLY STACKED POWER AND GROUND LINES

BACKGROUND

The present invention relates generally to the electrical, electronic and computer arts and, more particularly, to interconnect structures and their fabrication.

Silicon-based devices typically include multiple interconnect metallization layers above a device (front-end-of-line/FEOL) layer that contains field-effect transistors (FETs) and/or other structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. Back-end-of-line (BEOL) processing involves the creation of metal interconnecting wires that connect the devices formed in FEOL processing to form electrical circuits and may include silicidation as discussed above with respect to MOL processing. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. The interconnecting wires within each metal line are electrically connected to interconnecting wires in other metal lines and to the devices in the FEOL layer. BEOL processing typically includes low-temperature steps for forming metal wires and preserving temperature sensitive FEOL and MOL structures.

BEOL processing involves the formation of interconnects above the MOL layers. A chip may have multiple BEOL interconnect layers. Each layer, which has a wiring scheme, is connected to another layer by vias. Damascene copper wires are often chosen to reduce the wire resistance due to superior electrical conductivity of copper. The wires are formed within dielectric layers, one or more of which may comprise low-k material. Dual damascene patterning involves the deposition and patterning of hard masks on a dielectric layer to be patterned. A trench pattern can be etched into one hard mask and a via pattern can be formed in another hard mask. The via pattern is aligned with selected portions of the trench hard mask to facilitate formation of self-aligned vias (SAVs). Fully aligned vias (FAVs) use pre-existing under-layer metal for even narrower alignment in BEOL processing.

The metal interconnect layers obtained following BEOL processing can include power (Vdd) lines, ground (Vss) lines and signal lines. Vias are employed for electrically connecting one or more of the lines in a metal interconnect layer with other layers.

BRIEF SUMMARY

Interconnect structures having vertically stacked power and ground lines, thereby allowing additional signal tracks in a given area.

An interconnect structure includes a dielectric layer and metal interconnect lines within the dielectric layer. The metal interconnect lines include a power line, a ground line and a plurality of signal lines. The power line and the ground line are electrically isolated and arranged in a vertically stacked configuration within the dielectric layer. One of the power line and the ground line is entirely above the other of the power line and the ground line.

In a further aspect of the invention, a semiconductor structure includes a semiconductor substrate, a front-end-of-line layer on the semiconductor substrate, and a plurality of interconnect layers over the front-end-of-line layer. Each of the interconnect layers includes a dielectric layer having a top surface and a bottom surface and interconnect metal within the dielectric layer. The interconnect metal of at least one of the plurality of interconnect layers includes a power line, a ground line and signal lines within the dielectric layer. The power line and the ground line or a plurality of the signal lines are in a vertically stacked configuration within the dielectric layer.

A method of fabricating an interconnect structure includes forming a first trench in an interlevel dielectric layer, forming a plurality of second trenches in the interlevel dielectric layer, the first trench having a greater average width than the average width of each of the second trenches, filling the first trench and the plurality of second trenches with an interconnect metal layer, recessing the interconnect metal layer in the first trench, thereby forming an open space within the first trench above the recessed interconnect metal layer, depositing a horizontal dielectric cap layer within the open space and over the recessed interconnect metal layer, and depositing additional interconnect metal within the first trench and over the horizontal dielectric layer, the interconnect metal layer beneath the horizontal dielectric layer being electrically isolated by the horizontal dielectric layer from the additional interconnect metal above the horizontal dielectric layer.

Techniques and structures as disclosed herein can provide substantial beneficial technical effects. By way of example only and without limitation, one or more embodiments may provide one or more of the following advantages:

Allowing additional signal tracks with the same footprint;

Reducing power supply noise;

Allowing chip area shrink.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 is a schematic, cross-sectional view showing a portion of an interconnect layer following formation of a first set of trenches therein;

FIG. 2 is a schematic, cross-sectional view showing the structure of FIG. 1 following formation of a further power trench therein;

FIG. 3 is a schematic, cross-sectional view showing the structure of FIG. 2 following a first metallization and planarization;

FIG. 4 is a schematic, cross-sectional view thereof following recessing of the metal in the further trench;

FIG. 5 is a schematic, cross-sectional view thereof following deposition of a dielectric layer over the metal in the further trench;

FIG. 6 is a schematic, cross-sectional view showing the structure of FIG. 5 following a second metallization process and planarization;

FIG. 9A through FIG. 9F illustrate an alternative process flow for forming an interconnect structure including a power line, a ground line, and signal lines;

Figure 7:
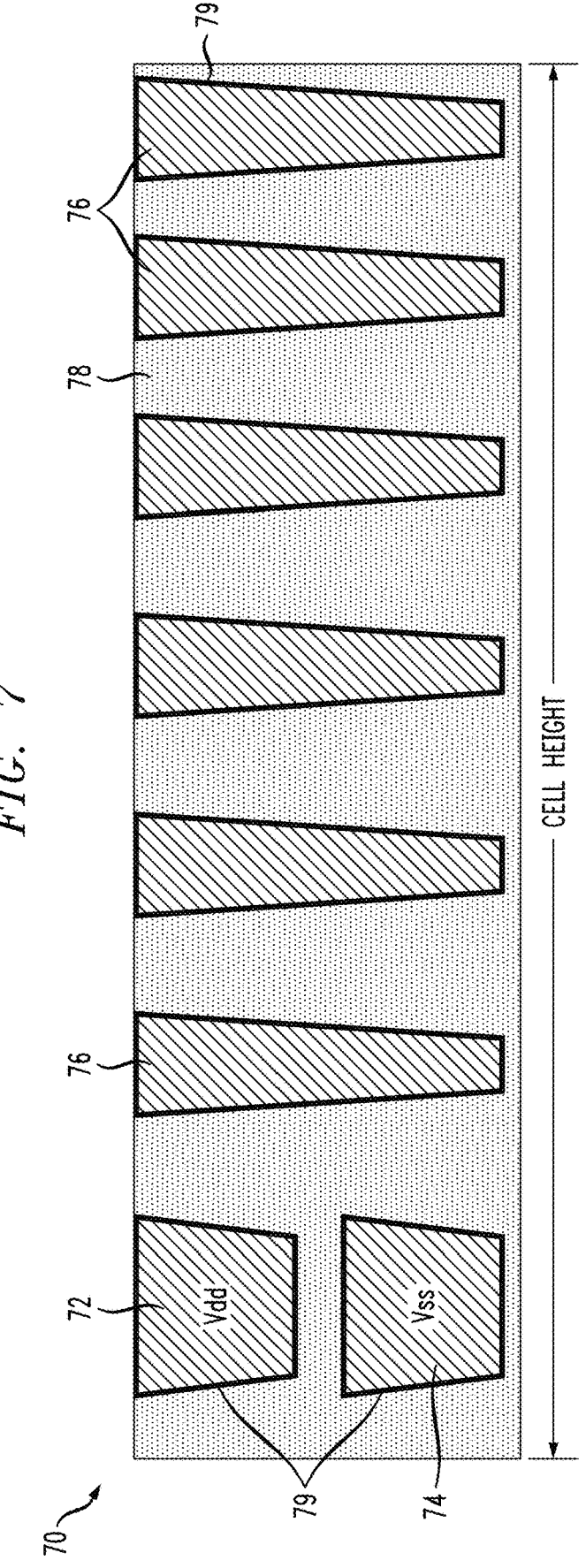
FIG. 7 is a schematic, cross-sectional view showing an alternative exemplary embodiment of an interconnect structure.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A standard cell is an integrated circuit that may be implemented with digital logic. An ASIC, for example, may contain thousands to millions of standard cells. A standard cell CMOS device may include a group of transistor and interconnect structures that provides a logic function or a storage function. A standard cell design may include active, gate, and metal levels. Examples of a standard cell include a NAND gate, a NOR gate, a flip-flop, and other similar logic circuits. The interconnect structures for standard cells may include power lines (Vss and Vdd) as well as signal lines formed in dielectric layers. The presence of power lines in interconnect structures formed over the active regions of a device, for example adjacent to one another or at cell boundaries and in the same horizontal plane, limits the space available for signal lines therein.

A patterned dielectric interconnect layer 20 as shown in FIG. 1 is formed following FEOL processing and, in some embodiments, formation of one or more underlying metallized interconnect layers (not shown). Interconnect line/via patterns are conventionally formed in interlevel dielectric (ILD) layers by using, for example, known damascene or dual damascene techniques. A patterning stack including hard masks and lithographic masks is formed on an ILD layer followed by etching steps. Specifically, a photoresist (not shown) may be applied over an ILD layer. The photoresist can be applied by any suitable technique, including, but not limited to coating or spin-on techniques. A mask (not shown), which is patterned with shapes defining trench openings and/or vias to be formed, is provided over the photoresist, and the mask pattern is transferred to the photoresist using a photolithographic process, which creates recesses in the uncovered regions of the photoresist. The patterned photoresist is subsequently used to create the same pattern of trenches and vias in the ILD layer through conventional etching typically used for forming trenches and contact holes. Dry etch (for example, a reactive ion etch) techniques may be employed to form such horizontally extending trenches and vertically extending vias. In some embodiments, the ILD layer includes multiple layers that may be selectively etched. After formation of trench openings and vias, the photoresist may be stripped by ashing or other suitable process from the ILD layer. The resulting structure may be subjected to a wet clean.

ILD layers may be deposited over a semiconductor substrate using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layers may include, but are not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below.

Referring again to FIG. 1, the patterned interconnect layer 20 comprises a dielectric layer 22 such as an ILD layer as described above. In some exemplary embodiments, the interconnect layer 20 may be used to form an M2/V1 layer. In other words, it is the second layer or level of the structure to include metal wiring, but the first level to include one or more vias. Vertically extending trenches 24S used to form parallel signal lines may be formed in the dielectric layer using damascene techniques as described above. It will be appreciated that only a portion of a dielectric layer 22 is shown in FIG. 1 and many more signal lines would typically be formed in such a layer.

Referring to FIG. 2, a further trench 24 is formed in the dielectric layer and runs parallel to the trenches 24S. The further trench 24 has a greater average width than the previously formed trenches 24S and may or may not extend deeper vertically within the dielectric layer 22 than the trenches 24S to be employed for signal lines. The trench opening of the further trench 24 has a greater width than the widths of the top openings of each of the signal line trenches 24S.

A liner (not shown) having barrier properties is formed on the resulting structure. The liner is formed by depositing conformal layer(s) of liner material(s) on the patterned dielectric (ILD) layer 22. The sidewalls and bottom surfaces of the trenches 24, 24S (and associated vias if present) within the dielectric layer 22 are lined with layer(s) of electrically conductive materials. The liner material may include one or more thin layers of material such as, for example, tantalum (Ta), tantalum nitride (TaN), titanium nitride (TIN), cobalt (Co), ruthenium (Ru), tungsten (W), tungsten nitride (WN), titanium-tungsten (TiW), tungsten nitride (WN), manganese (Mn), manganese nitride (MnN) or other liner materials (or combinations of liner materials) such as RuTaN, Ta/TaN, CoWP, NiMoP, NiMoB which are suitable for the given application. The thin liner serves as a barrier diffusion layer and adhesion layer. The conformal layer of liner material may be deposited using known techniques such as CVD, ALD, or PVD.

In an exemplary embodiment, a barrier layer including TaN or TiN is deposited directly on the patterned dielectric layer 22 and a cobalt or ruthenium liner is deposited on the barrier layer to form the liner. A thin conformal copper (Cu) seed layer (not shown) can be deposited over the surface of the liner using PVD, followed by the electroplating of Cu to fill the damascene (or dual damascene) openings in the dielectric layer 22. A thermal anneal stage follows electroplating. A low-temperature thermal anneal (<200° C.) may be performed in some embodiments. In one example, cobalt is present in thin layers as a metal liner layer (e.g., 1 to 100 angstroms) between a TaN barrier layer and a Cu fill layer. The deposited layers form parallel metal signal lines 26 that extend within the dielectric layer 22 and a further metal line 28 within the trench 24. One or more of the metal lines may be electrically connected to an underlying interconnect layer. The overburden barrier, liner, seed, and metallization materials may be removed by performing a multi-step chemical mechanical polishing process (CMP) to planarize the surface of the monolithic structure down to the top surface of the dielectric layer 22. A structure 30 as schematically illustrated in FIG. 3 may be obtained following CMP.

The metal fill layer forming the further metal interconnect line 28 is recessed selective to the barrier layer (not shown) and to the dielectric layer 22 to obtain a structure 40 as shown in FIG. 4. A timed, selective etch can be employed to remove a predetermined amount of metal. In some embodiments, a selective Cu/CuO etch is conducted to open a void in the metal interconnect line 28. A timed wet etch may, for example, be employed for isotropically removing copper oxide and copper. As known in the art, alpha amino acid complexants including, for example, alanine, are suitable for selectively removing copper oxide and copper. Effective copper oxide removal has also been demonstrated using ammonia plasma and hydrogen plasma. The remaining metal in the trench 24 forms a ground (Vss) line 28 in some exemplary embodiments. The metal signal lines 26 are protected by a block mask (not shown) during this step and accordingly remain intact.

A dielectric cap layer 34 is conformally deposited using a suitable deposition technique, such as, for example, CVD, PECVD, RFCVD, PVD, ALD, MBD, PLD, and/or sputtering. The cap layer 34 may comprise, for example, silicon nitride (SiN), aluminum oxide (AlO$_x$), aluminum nitride (AlN) or other suitable dielectric material. A dielectric cap layer comprising high-k dielectric material is preferred in one or more embodiments to increase decoupling capacitance, which in turn reduces power supply noise. Materials such as SiN and AlO$_x$ also inhibit the diffusion of copper. The dielectric cap layer 34 can have a vertical thickness ranging from about five to fifteen nanometers (5 nm to about 15 nm) in an exemplary embodiment. Such thickness range should be considered exemplary as opposed to limiting. A multilayer dielectric cap comprised of two or more different materials and having a total thickness in the range of five to fifteen nanometers may be employed in some embodiments. A structure 50 as shown in FIG. 5 may be obtained following dielectric cap formation.

A further metallization process and CMP are performed to obtain an interconnect structure 60 as schematically illustrated in FIG. 6. The interconnect structure 60 includes vertically stacked power (Vdd) and ground (Vss) lines 36, 28 and an array of signal lines 26. The top surfaces of the power (Vdd) line 36 and signal lines 26 are coplanar. The entirety of the power Vdd line is above the ground Vss line in the exemplary embodiment. The metal interconnect elements are within the same metal interconnect level (for example, M2/V1, M3/V2, etc.) of a chip. As discussed below, such metal interconnect levels may include vertically extending vias (not shown in FIGS. 1-6).

The further metallization stage of the process may include deposition of a further liner. The selective etch to open the void in the interconnect metal within the trench 24, as discussed above with respect to FIG. 4, may damage the previously formed liner and adhesion layers. The deposition of a second liner (not shown) helps ensure an effective barrier layer is present during subsequent electroplating. The second liner may include tantalum (Ta), tantalum nitride (TaN), and/or other diffusion barrier material and can be deposited using physical vapor deposition (PVD) or atomic layer deposition (ALD). A liner thickness in the range of 10-60 Å is provided in some exemplary embodiments. The portions of the second liner extending horizontally over the top surfaces of the dielectric layer 22 are removed, leaving vertically extending portions of the second liner adjoining the exposed upper sidewalls of the trench 24.

A second seed layer (not shown) may be deposited on the structure following removal of the horizontal portions of the second liner. The second seed layer may be a copper seed layer deposited using physical vapor deposition (PVD) or other suitable process. Seed layer deposition is followed by deposition of interconnect metal, repeating the process described above with respect to FIG. 3. Deposition of interconnect metal by electroplating the metal is preferred in some embodiments. The newly deposited interconnect metal fills the open space within the upper portion of the trench 24 above the dielectric cap layer 34. Excess metal interconnect material (overburden) deposited by electroplating on the top surfaces of the structure is removed. The structure is thermally annealed following deposition of the additional metal interconnect material in the trench 24 that forms the power Vdd line 36. Alternatively, interconnect metal can be deposited within the top portion of the trench 24 by electroless plating. Electroless copper deposition above the dielectric cap layer 34 within the trench 24 can be conducted without prior deposition of a seed layer.

Interconnect structures 60 as described herein facilitate adoption of scaled down technology nodes. The vertically stacked positioning of the relatively wide power and ground lines 36, 28 allow additional signal lines 24 within the same footprint. The processes described herein may, if desired, employ currently existing conformal metal deposition and metal etch processes, allowing their implementation within existing facilities using existing tooling. It will be appreciated that new deposition and etch processes having application to the processes discussed herein may be developed and adopted.

An alternative embodiment of an interconnect structure 70 including vertically stacked, parallel power (Vdd) and ground (Vss) lines 72, 74, respectively, is schematically illustrated in FIG. 7. The depicted interconnect structure 70 forms one metallized level (e.g. M1, M2, M3, etc.) above an FEOL layer (not shown). A dielectric cap layer (not shown) may adjoin the bottom of the interconnect structure 70 to separate the lines therein from an underlying layer, such as a FEOL or MOL layer. A further dielectric cap layer (not shown) may be present at the top of the interconnect structure 70. In this exemplary embodiment, the depth of the signal lines 76 exceeds the combined depths of the power and ground lines 72, 74. The power Vdd line and the ground Vss line both have greater average widths than the average widths of the signal lines. The widths of the power Vdd and ground Vss lines as measured at the top surfaces thereof are also greater than the corresponding widths of the signal lines. The relatively deep signal lines 76 of the interconnect structure 70 provide greater electrically conductive areas and therefor relatively low line resistance. A barrier liner 79 as described above lines the walls of the trenches in the ILD layer 78 in which the power, ground and signal lines are contained. A metal cap layer (not shown) may be selectively deposited on the exposed top surfaces of the metal interconnect lines formed within the trenches. For example, metals including, but not limited to, cobalt, ruthenium or manganese may be deposited using chemical vapor deposition or atomic layer deposition to form the metal cap layer. In some embodiments, the metal cap layer comprises materials immiscible with liquid copper such as Ta or Ru. Post-deposition cleaning may be required.

Cell height is indicated in FIG. 7. The relatively wide power Vdd and ground Vss lines are adjacent to each other and vertically stacked at one end of the cell in the exemplary embodiment. The entirety of the power Vdd line 72 is above the ground Vss line 74. The longitudinal axis of the power Vdd line is directly above the longitudinal axis of the ground Vss line. The relatively narrow signal lines 76 are arranged horizontally across the structure and are not vertically stacked. As discussed above, while the figure shows only a small number of signal lines 76, a cell may include many more such lines.

Figure 8:
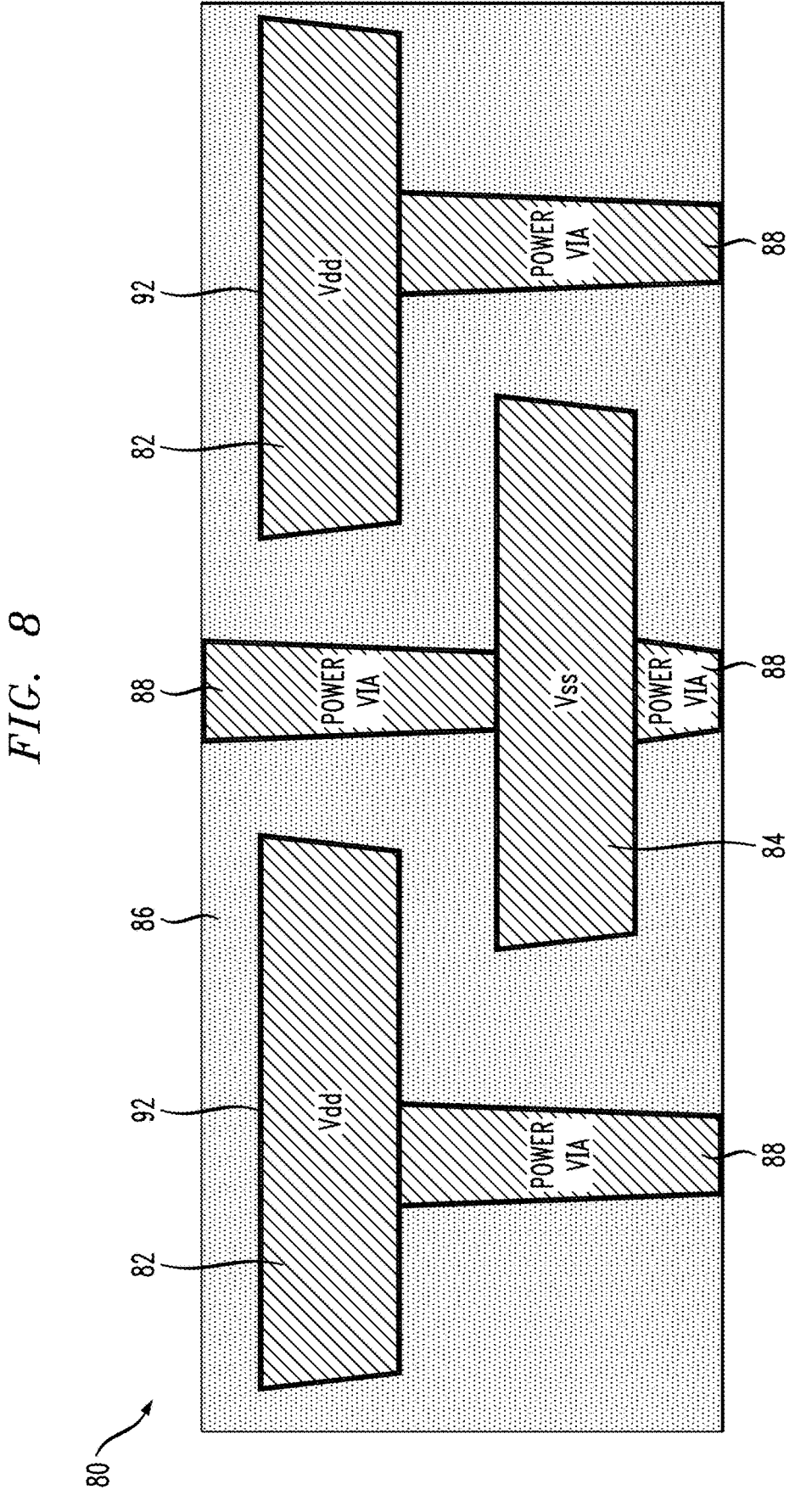
FIG. 8 is an enlarged, schematic, cross-sectional view showing a portion of an interconnect structure including vias connected to vertically stacked power and ground lines.

A sectional view of a portion of an interconnect structure 80 including vertically stacked power and ground lines 82,84 formed within a dielectric layer 86 is shown in FIG. 8. The power line and the bottom one of the ground lines are only partially overlapping in the exemplary embodiment to provide spaces for via connections. It will be appreciated that if no via connections are required in a given region, the lines can overlap one another for a much larger run length. In other words, the power and ground lines only need to be discontinuous when a via connection is required above or below. First and second (top) power Vdd lines 84 are formed in the same plane and are entirely above the bottom ground Vss line. Vias 88 including electrically conductive metal fill are also shown in this view. The vias can, for example, be employed for electrically connecting the power and ground lines 82, 84 to other interconnect structures (not shown) on a chip. Signal lines within the interconnect structure 80 and running parallel to the power and ground lines are not shown in the figure. A conformal liner 92 having barrier properties adjoins the side walls of the trenches and holes within the dielectric layer that contain the power and ground lines and the vias. The stacked power and ground lines can function as a power staple in some embodiments. While the power and ground lines are embedded in the dielectric layer 86, the vias 88 extend to the top and bottom surfaces thereof.

In summary, the exemplary interconnect structure 80 includes a power Vdd line 82 and a ground Vss line 84 over the same top plane and a bottom ground Vss line 84 entirely beneath the top plane. A high-k dielectric cap (not shown) is optionally provided above the bottom ground Vss line 84. In embodiments wherein the Vss line 84 comprises, for example, cobalt, ruthenium, tungsten, iridium or rhodium, a high-k dielectric cap is unnecessary. A high-k dielectric cap layer (not shown) may adjoin the top surface of the interconnect structure 80. Vias extend from the power and ground lines above the top plane to the bottom surface of the dielectric layer 86. Further vias 88 extend to both the top and bottom surfaces of the dielectric layer 86 from the bottom ground Vss line.

Stages of an alternative process for forming an interconnect structure including vertically stacked Vdd and Vss lines are schematically illustrated in FIG. 9A through FIG. 9F. In this exemplary process, interconnect metal is deposited over a substrate and portions of the interconnect metal are removed to form signal lines and Vss or Vdd lines that are wider than the signal lines. In some embodiments, the substrate over which the interconnect metal is deposited is an underlying interconnect structure. A blanket metal deposition process forms a metal (for example, copper) layer 102 as shown in FIG. 9A. Discrete signal lines 102S are formed by etching vertical trenches through selected portions of the metal layer 102, as schematically illustrated in FIG. 9B. Each of the resulting signal lines is separated by a trench 104. A relatively wide portion of the remaining metal layer 102 is also separated from an adjoining signal line 102S by one of the trenches 104.

The relatively wide metal portion is recessed to form a relatively wide ground (Vss) line 102G in an exemplary embodiment. The signal lines 102S are protected during the recessing of the metal, which may be performed using a wet etch as described above. The resulting structure includes discrete ground and signal lines as schematically illustrated in FIG. 9C.

A dielectric (ILD) layer 106 is deposited on the resulting structure, extending over the Vss line 102G and filling the trenches 104. Exemplary interlevel dielectric materials usable in interconnect layers are discussed above. The dielectric layer 106 is planarized down to the top surfaces of the signal lines 102S to obtain a structure as illustrated in FIG. 9D.

The ILD layer 106 may be subjected to a dry etch to form an open trench 108 directly above the ground Vss line 102G. The etch may be timed such that a layer of dielectric material remains over the Vss line 102G. Conventional lithography and etching processes may be employed to pattern the ILD layer. A wet cleaning step may follow dry etching. A diffusion barrier liner (not shown) and an adhesion layer (not shown) are deposited sequentially on the resulting structure, thereby lining the dielectric surfaces adjoining the open trench 108. FIG. 9E schematically illustrates an exemplary structure including an open trench 108 formed in an ILD layer over a ground Vss line 102G.

An interconnect structure 90 as schematically illustrated in FIG. 9F is obtained following metallization and planarization steps. The interconnect structure 90 includes a power Vdd line 110P formed within the open trench. The power Vdd line is aligned with the underlying Vss line such that the longitudinal axes of the two lines are also vertically aligned. Electrical isolation of the Vss and Vdd lines is provided by a portion of the ILD layer 106. The vertically stacked Vdd/Vss lines 110P, 102G are horizontally spaced from the adjoining signal line 102S and electrically isolated therefrom. The average widths of each of the vertically stacked Vdd/Vss lines is larger than the average widths of the signal lines 102S. The height of each signal line is greater than the height of the vertically stacked lines, both individually and in total. In some embodiments, a high-k dielectric layer (not shown) is formed between the vertically stacked lines. As indicated above, such a high-k dielectric layer will increase decoupling capacitance, which in turn reduces power supply noise. The extra signal lines allowed in a given standard cell size by the exemplary wiring configuration facilitates improvements in routing and utilization.

Figures 10A, 10B, 10C:
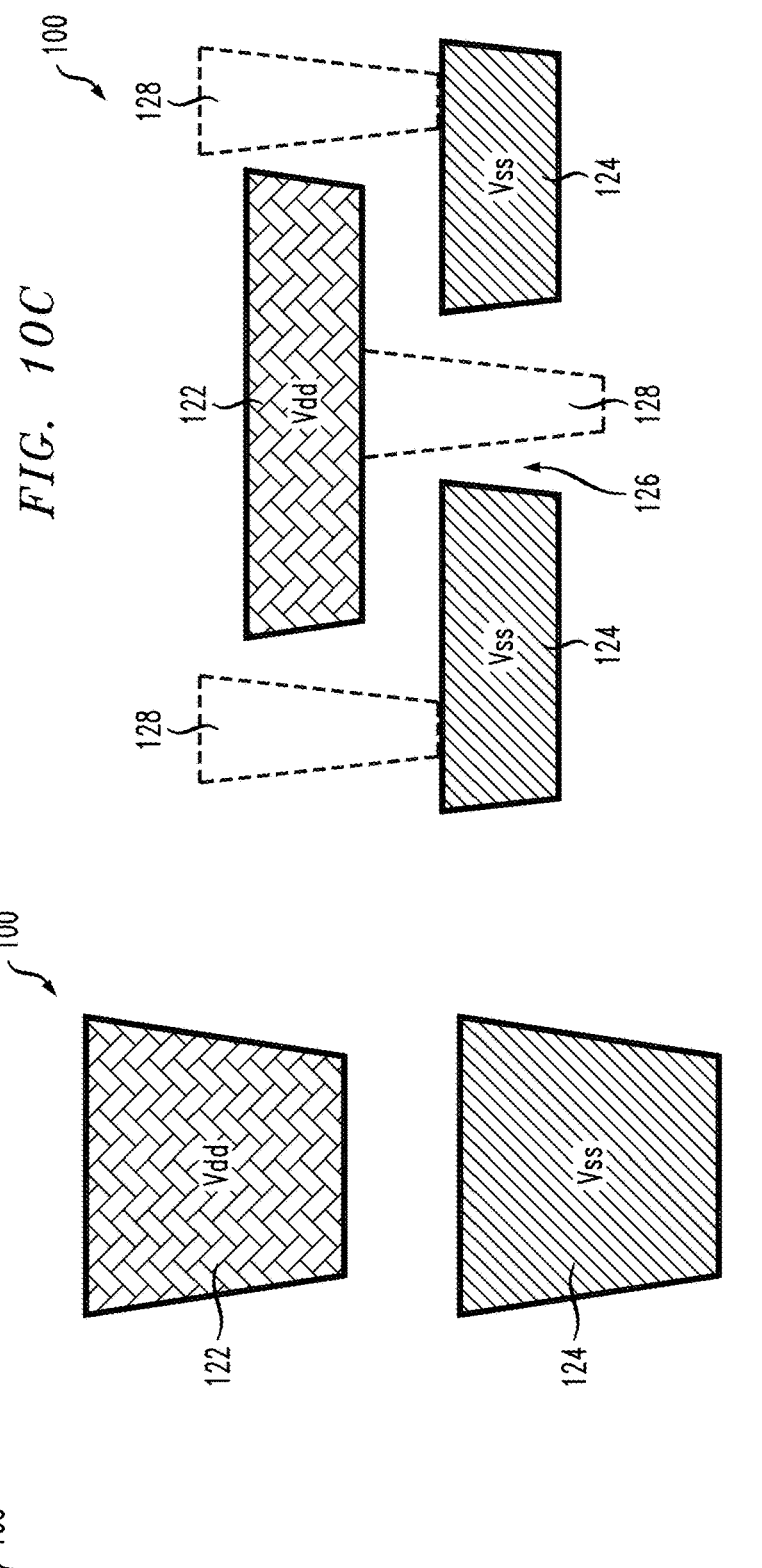
FIG. 10A is a schematical top plan view of a portion of an exemplary interconnect structure.
FIG. 10B is a sectional view of the portion of the interconnect structure illustrated in FIG. 10A.
FIG. 10C is a further sectional view of the portion of the interconnect structure illustrated in FIG. 10A.

FIG. 10A, FIG. 10B and FIG. 10C provide various views of an arrangement 100 of vertically stacked power and ground lines formed as discontinuous, coaxial segments. The power and ground lines within the interconnect structures discussed above may include power and ground lines arranged in similar configurations. The segments are discontinuous to allow via connections. An exemplary power or ground line run length may be a few hundred nanometers to a few tens of microns. The length of the discontinuous portion would typically be on the order of a few hundred nanometers, which is enough space to form a via. The run lengths of the lines would be dependent on how frequently via connections need to be made to the lines located above/below. For frequent via connections, the run lengths would be relatively short while for fewer via connections the run length could be longer.

A top plan view of the exemplary arrangement 100 of power and ground lines is provided in FIG. 10A. A segment 122 of a power Vdd line is positioned above underlying segments 124 of a ground Vss line. The segment 122 of the power Vdd line is directly above opposing end portions of the segments 124 of the ground Vss line as well as a region 126 between the line segments 124, as illustrated in FIG. 10C. As discussed above, this region 126 has a length that is sufficient to allow formation of a via 128 extending downwardly from the segment 122. The line segments 122, 124 may or may not have the same length dimensions. As the line segment 122 of the power Vdd line only partially overlaps the line segments 124 of the ground Vss line, further vias 128 may be formed that extend upwardly from the line segments 124 and between segments of the power Vdd line. The vias 128 may be connected to interconnect layers (not shown) located below and above the interconnect layer comprising the line segments 122, 124 in some embodiments. As shown in FIG. 10A and FIG. 10B, the line segments 122, 124 comprising portions of the power Vdd line and the ground Vss line are vertically stacked.

Figure 11:
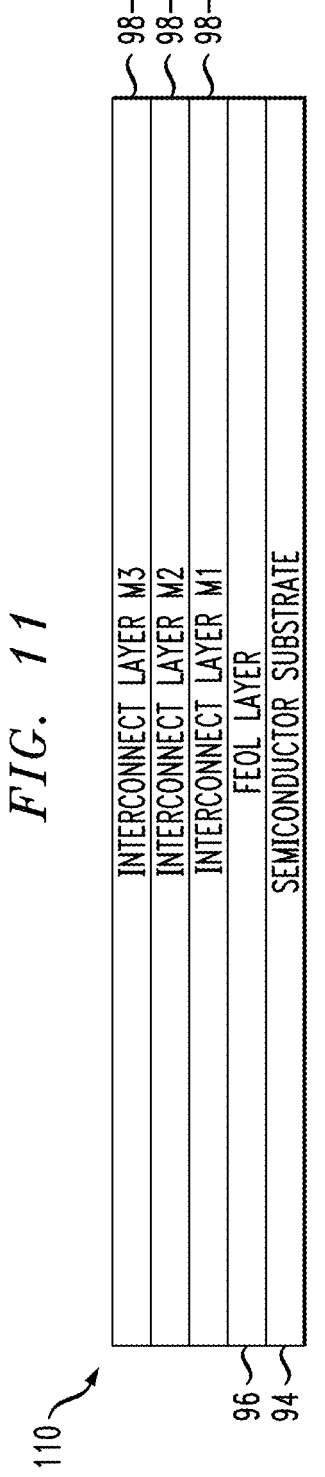
FIG. 11 is a schematic illustration of a semiconductor structure including interconnect structures.

A semiconductor structure 110 such as a standard cell is schematically illustrated in FIG. 11. The semiconductor structure includes a front-end-of-line (FEOL) layer 96 on a semiconductor substrate 94. The FEOL layer may include field-effect transistors, storage capacitors, and/or other electronic elements. A stack of interconnect layers M1, M2, M3 (98-1, 98-2, 98-3) extend, respectively, over the FEOL layer. Interconnect structures 60, 70, 80 as described above may comprise one or more of such a stack of interconnect layers or further interconnect layers that may be formed over the FEOL layer.

Figure 12:
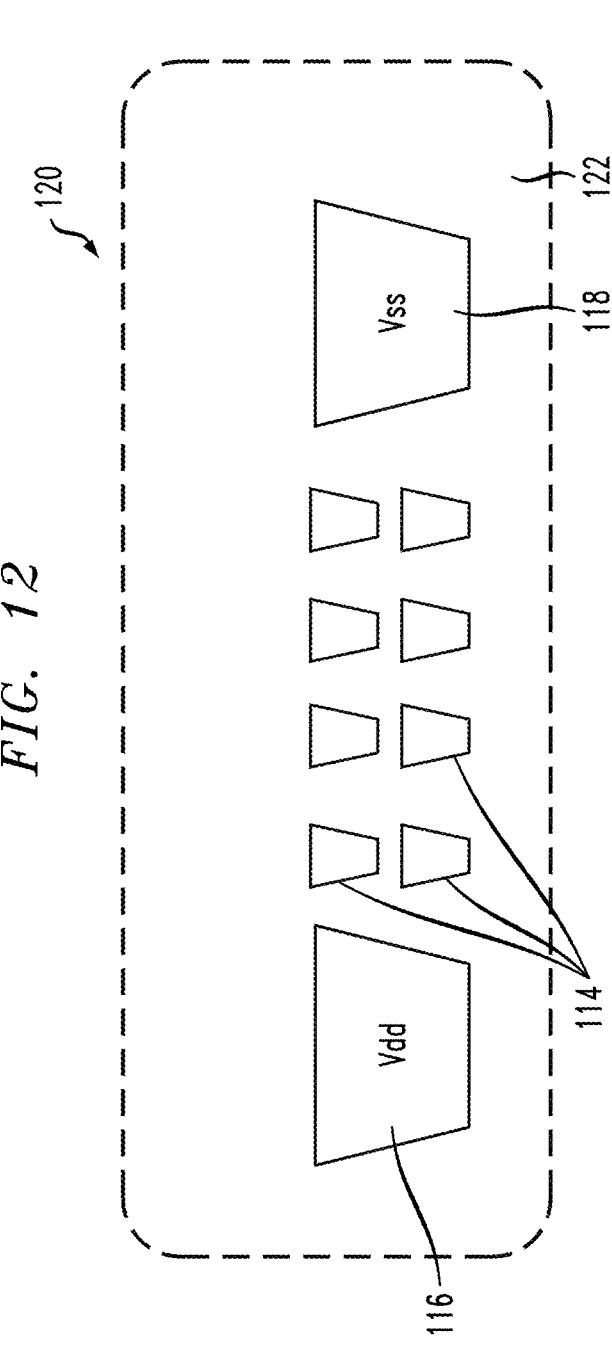
FIG. 12 is a schematic illustration of an interconnect structure including vertically stacked signal lines.

FIG. 12 shows an alternative exemplary interconnect structure 120 wherein the relatively narrow signal lines 114 are vertically stacked. The relatively wide power Vdd line 116 and ground Vss line 118 of the exemplary interconnect structure 120 are both in the same horizontal plane. Two rows of signal lines 114 within an interlevel dielectric (ILD) layer 122 are arranged such that pairs of vertically stacked signal lines are formed therein. A layer of dielectric material, such as a portion of the ILD layer 122, electrically isolates the top signal lines from the bottom signal lines of the interconnect structure 120. In the exemplary embodiment, the longitudinal axis of each top signal line of a vertically stacked pair is vertically aligned with the longitudinal axis of the bottom signal line of the vertically stacked pair. The power Vdd line 116 is on a first side of the array of vertically stacked signal lines 114 while the ground Vss line 118 is on a second side thereof opposite from the first side. The average width of the power Vdd line 116 is greater than the average width of each signal line 114. The average width of the ground Vss line 118 is also greater than the average width of each signal line 114. The depth of both the power Vdd line 116 and the ground Vss line also exceed the combined depths of the signal lines 114 forming each vertically stacked pair. The arrangement allows a greater number of signal lines to be formed within a given area of an interconnect layer.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1st *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnect layers and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom", and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An interconnect structure comprising:
a dielectric layer; and
metal interconnect lines within the dielectric layer, the metal interconnect lines including:
a power line;
a ground line; and
a plurality of signal lines;
the power line and the ground line being electrically isolated and arranged in a vertically stacked configuration within the dielectric layer, one of the power line and the ground line being entirely above the other of the power line and the ground line, wherein a top-most surface of the dielectric layer is coplanar with top surfaces of the power line and at least one of the signal lines.

2. The interconnect structure of claim 1, wherein the power line and the ground line have a combined height smaller than the heights of the signal lines.

3. The interconnect structure of claim 2, wherein the power line and the signal lines have coplanar top surfaces.

4. The interconnect structure of claim 1, further including a high-k dielectric cap layer between the power line and the ground line.

5. The interconnect structure of claim 4, wherein the high-k dielectric cap layer directly contacts a top surface of the ground line.

6. The interconnect structure of claim 4, wherein the power line and the ground line have larger average widths than the average widths of the signal lines.

7. The interconnect structure of claim 1, wherein the power line runs parallel to and overlaps at least an end portion of the ground line.

8. The interconnect structure of claim 7, further including a high-k dielectric cap layer between the power line and the ground line.

9. The interconnect structure of claim 1, wherein the power line comprises a plurality of line segments and partially overlaps the ground line.

10. A semiconductor structure comprising:
a semiconductor substrate;
a front-end-of-line layer on the semiconductor substrate;
a plurality of interconnect layers over the front-end-of-line layer, each of the interconnect layers including a dielectric layer and interconnect metal within the dielectric layer;
the interconnect metal of at least one of the plurality of interconnect layers comprising:
a power line;
a ground line; and
signal lines within the dielectric layer;
the power line and the ground line or a plurality of the signal lines being in a vertically stacked configuration within the dielectric layer, wherein a top-most surface of the dielectric layer is coplanar with top surfaces of the power line and at least one of the signal lines.

11. The semiconductor structure of claim 10, wherein the power line and the ground line are in the vertically stacked configuration within the dielectric layer.

12. The semiconductor structure of claim 11, wherein the power line and the signal lines have coplanar top surfaces, the power line and the ground line having a combined height smaller than the heights of the signal lines.

13. The semiconductor structure of claim 11, further including a high-k dielectric cap layer between the power line and the ground line.

14. The semiconductor structure of claim 11, wherein the power line and the ground line have larger average widths than the average widths of the signal lines.

15. The semiconductor structure of claim 14, wherein the power line and the ground line are comprised of discontinuous metal line segments.

16. The semiconductor structure of claim 15, wherein the semiconductor substrate, the front-end-of-line layer, and the plurality of interconnect layers comprise a standard cell, the power line and the ground line adjoining an edge of the standard cell.

17. The semiconductor structure of claim 10, wherein the signal lines are in the vertically stacked configuration within the dielectric layer, the signal lines forming an array of signal lines including a top row of parallel signal lines and a bottom row of parallel signal lines within the dielectric layer, the parallel signal lines within the top row being vertically aligned with and electrically isolated from the parallel signal lines within the bottom row.

18. The semiconductor structure of claim 17, wherein the power line is positioned on a first side of the array and the ground line is positioned on a second side of the array opposite from the first side; the power line having a greater average width than the average width of each of the signal lines, and the ground line having a greater average width than the average width of each of the signal lines.

*     *     *     *     *